US012642090B2

(12) United States Patent  
Im et al.

(10) Patent No.: US 12,642,090 B2  
(45) Date of Patent: May 26, 2026

(54) SEMICONDUCTOR DEVICE PACKAGE ASSEMBLIES HAVING A PRE-APPLIED THERMALLY CONDUCTIVE ADHESIVE

(71) Applicant: SEMICONDUCTOR COMPONENTS INDUSTRIES, LLC, Phoenix, AZ (US)

(72) Inventors: Seungwon Im, Seoul (KR); Jeungdae Kim, Gimpo (KR); Oseob Jeon, Seoul (KR); Byoungok Lee, Yeonsu-gu (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 679 days.

(21) Appl. No.: 18/054,229

(22) Filed: Nov. 10, 2022

(65) Prior Publication Data

US 2024/0162110 A1 May 16, 2024

(51) Int. Cl.  
*H10W 40/25* (2026.01)  
*H10W 40/70* (2026.01)  
(Continued)

(52) U.S. Cl.  
CPC ......... *H10W 40/255* (2026.01); *H10W 40/70* (2026.01); *H10W 70/411* (2026.01);  
(Continued)

(58) Field of Classification Search  
CPC ... H01L 23/291; H01L 23/367; H01L 23/373; H01L 23/3735; H01L 23/49503;  
(Continued)

(56) References Cited

U.S. PATENT DOCUMENTS

| | | | |
|---|---|---|---|
| 11,302,665 B2 * | 4/2022 | Otsuka | H01L 23/3735 |
| 11,367,669 B2 * | 6/2022 | Hatano | H01L 25/18 |

(Continued)

FOREIGN PATENT DOCUMENTS

| | | |
|---|---|---|
| DE | 102006059501 A1 | 7/2007 |
| JP | H04179154 A | 6/1992 |

(Continued)

OTHER PUBLICATIONS

International Search Report and Written Opinion for PCT Application No. PCT/US2024/027990, mailed on Jan. 22, 2025, 14 pages.

*Primary Examiner* — Khiem D Nguyen  
(74) *Attorney, Agent, or Firm* — Brake Hughes Bellermann LLP

(57) ABSTRACT

In a general aspect, a semiconductor device package can include a die attach paddle having a first surface and a second surface that is opposite the first surface; a semiconductor die coupled with the first surface of the die attach paddle, and a direct-bonded-metal (DBM) substrate The DBM substrate can include a ceramic layer having a first surface and a second surface that is opposite the first surface, a first metal layer disposed on the first surface of the ceramic layer and coupled with the second surface of the die attach paddle, a second metal layer disposed on the second surface of the ceramic layer, and a thermally conductive adhesive disposed on the second metal layer, At least a surface of the thermally conductive adhesive can be exposed external to the device package. The thermally conductive adhesive can be configured for coupling the device package with a thermal dissipation appliance.

20 Claims, 9 Drawing Sheets

(51) Int. Cl.
 *H10W 70/40* (2026.01)
 *H10W 74/01* (2026.01)
 *H10W 74/10* (2026.01)
 *H10W 90/00* (2026.01)

(52) U.S. Cl.
 CPC .......... *H10W 74/01* (2026.01); *H10W 74/111* (2026.01); *H10W 90/736* (2026.01)

(58) Field of Classification Search
 CPC ................ H01L 23/4334; H01L 23/42; H01L 23/49562; H01L 23/49524; H01L 23/3107; H01L 24/29; H01L 24/32; H01L 24/83; H01L 2224/32245; H10W 40/70; H10W 40/255; H10W 70/411; H10W 74/111; H10W 90/736
 See application file for complete search history.

(56) References Cited

U.S. PATENT DOCUMENTS

| | | | |
|---|---|---|---|
| 2002/0171134 A1 | 11/2002 | Choi | |
| 2012/0211213 A1 | 8/2012 | Kitajima | |
| 2013/0020672 A1* | 1/2013 | Tipton | H01L 25/072 |
| | | | 257/496 |
| 2013/0252381 A1 | 9/2013 | Spann et al. | |
| 2014/0043765 A1 | 2/2014 | Gohara et al. | |
| 2014/0225267 A1* | 8/2014 | Zommer | H01L 24/48 |
| | | | 257/762 |
| 2017/0178998 A1 | 6/2017 | Jeun et al. | |
| 2020/0098701 A1* | 3/2020 | Harada | H01L 23/047 |
| 2020/0388557 A1 | 12/2020 | Yoo et al. | |
| 2021/0066174 A1* | 3/2021 | Im | H01L 23/49506 |
| 2024/0038632 A1 | 2/2024 | Prajuckamol et al. | |

FOREIGN PATENT DOCUMENTS

| | | |
|---|---|---|
| JP | 2005303063 A | 10/2005 |
| WO | 2016111059 A1 | 7/2016 |

* cited by examiner

730

125

720

115b

DEVICE
TEST

710

100

125

110b

115b

1400

ATTACH SEMICONDUCTOR DIE TO
DIE ATTACH PADDLE — 1410

SOLDER PRINT ON ISOLATION SUSTRATE AND/OR
DIE ATTACH PADDLE — 1420

REFLOW SOLDER TO COUPLE ISOLATION SUBSTRATE
TO DIE ATTACH PADDLE — 1430

FORM WIRE BOND(S) — 1440

ENCAPSULATE WITH MOLDING COMPOUND — 1450

TRIM, FINISH AND TESTING — 1460

TAPE AND REEL PACK — 1470

1500

ATTACH SEMICONDUCTOR DIE TO
DIE ATTACH PADDLE
— 1510

SOLDER PRINT ON ISOLATION SUSTRATE AND/OR
DIE ATTACH PADDLE
— 1520

REFLOW SOLDER TO COUPLE ISOLATION SUBSTRATE
TO DIE ATTACH PADDLE
— 1530

FORM WIRE BOND(S)
— 1540

ENCAPSULATE WITH MOLDING COMPOUND
— 1550

TRIM, FINISH AND TESTING
— 1560

APPLY AND CURE CONDUCTIVE ADHESIVE MATERIAL
— 1570

TAPE AND REEL PACK
— 1580

SEMICONDUCTOR DEVICE PACKAGE ASSEMBLIES HAVING A PRE-APPLIED THERMALLY CONDUCTIVE ADHESIVE

TECHNICAL FIELD

This description generally relates to semiconductor device package assemblies, such as semiconductor device package assemblies with electrically isolated, external thermal dissipation surfaces and/or pre-applied conductive adhesive material for thermal dissipation appliance attachment, and associated methods of manufacture.

BACKGROUND

Implementations of semiconductor device packages can include an isolation substrate with low thermal resistance. The isolation substrate can dissipate heat generated by operation of one or more semiconductor devices (die) included in the package, and can also provide electrical isolation between an externally exposed surface, thermal dissipation surface (e.g., a metallic surface) and the one or more semiconductor die and/or a die attach paddle on which the one more die are disposed. For instance, an isolation substrate can include a thermally conductive and electrically insulative base layer (e.g., a ceramic material), a first metal layer disposed on a first surface of the base layer, and a second metal layer disposed on a second surface of the base layer that is opposite the first surface. The base layer can electrically isolate the first metal layer from the second metal layer, one of the metal layers can be coupled to a die attach paddle (e.g., soldered), and the other metal layer can be the externally exposed, thermal dissipation surface.

SUMMARY

In a general aspect, the techniques described herein relate to a semiconductor device package including a die attach paddle having a first surface and a second surface that is opposite the first surface, a semiconductor die coupled with the first surface of the die attach paddle, and a direct-bonded-metal (DBM) substrate. The DBM substrate includes a ceramic layer having a first surface and a second surface that is opposite the first surface, a first metal layer disposed on the first surface of the ceramic layer and coupled with the second surface of the die attach paddle, a second metal layer disposed on the second surface of the ceramic layer. The semiconductor package further includes a thermally conductive adhesive disposed on the second metal layer. At least a surface of the thermally conductive adhesive is exposed external to the semiconductor device package, and the thermally conductive adhesive is configured for coupling the semiconductor device package with a thermal dissipation appliance.

Implementations can include one or more of the following aspects. For instance, in some aspects, the techniques described herein relate to a semiconductor device package, wherein the thermally conductive adhesive is electrically conductive.

In some aspects, the techniques described herein relate to a semiconductor device package, where the second metal layer includes a recess, a portion of the thermally conductive adhesive being disposed in the recess.

In some aspects, the techniques described herein relate to a semiconductor device package where the second metal layer includes a notch disposed at a perimeter edge of the second metal layer, and a portion of the thermally conductive adhesive is disposed in the notch.

In some aspects, the techniques described herein relate to a semiconductor device package where a first surface of the second metal layer is coupled with the second surface of the ceramic layer, and a second surface of the second metal layer is coupled with a first surface of the thermally conductive adhesive. The semiconductor device package can further include a molding compound encapsulating the die attach paddle and the semiconductor die, and partially encapsulating the DBM substrate, such that the second surface of the second metal layer is exposed through the molding compound.

In some aspects, the techniques described herein relate to a semiconductor device package where the second surface of the second metal layer is recessed in the molding compound, and a second surface of the thermally conductive adhesive opposite the first surface of the thermally conductive adhesive is coplanar with a surface of the molding compound.

In some aspects, the techniques described herein relate to a semiconductor device package wherein the second surface of the second metal layer is coplanar with a surface of the molding compound, and a second surface of the thermally conductive adhesive opposite the first surface of the thermally conductive adhesive is non-coplanar with the surface of the molding compound.

In some aspects, the techniques described herein relate to a semiconductor device package wherein the first metal layer includes an etched pattern disposed around at least a portion of a perimeter of the first metal layer, and the etched pattern is defined by removing a portion of the first metal layer.

In another general aspect, the techniques described herein relate to a semiconductor device package including a die attach paddle having a first surface and a second surface that is opposite the first surface, a semiconductor die coupled with the first surface of the die attach paddle, and a direct-bonded-metal (DBM) substrate including: a ceramic layer having a first surface and a second surface that is opposite the first surface. The DBM substrate includes a first metal layer disposed on the first surface of the ceramic layer that is coupled with the second surface of the die attach paddle, and a second metal layer disposed on the second surface of the ceramic layer. The first metal layer includes an etched pattern disposed around at least a portion of a perimeter of the first metal layer. The etched pattern is defined by removing a portion of the first metal layer.

Implementations can include one or more of the following aspects. For instance, in some aspects, the techniques described herein relate to a semiconductor device package where the first metal layer includes a central, planar portion.

In some aspects, the techniques described herein relate to a semiconductor device package where the etched pattern includes a plurality of posts defined from the first metal layer.

In some aspects, the techniques described herein relate to a semiconductor device package where the etched pattern includes a plurality of recesses defined in the first metal layer.

In some aspects, the techniques described herein relate to a semiconductor device package where the removed portion of the first metal layer exposes a corresponding portion of the first surface of the ceramic layer.

In some aspects, the techniques described herein relate to a semiconductor device package where the etched pattern extends around an entire perimeter of the first metal layer.

In some aspects, the techniques described herein relate to a semiconductor device package that further includes a thermally conductive adhesive layer disposed on the second metal layer and exposed external to the semiconductor device package. The thermally conductive adhesive layer being configured for coupling the semiconductor device package with a thermal dissipation appliance.

In another general aspect, the techniques described herein relate to a method for producing a semiconductor device package. The method includes coupling a semiconductor die with a first surface of a die attach paddle having a first surface and a second surface that is opposite the first surface, and coupling a direct-bonded-metal (DBM) substrate with a second surface of the die attach paddle opposite the first surface of the die attach paddle. The DBM substrate includes a ceramic layer having a first surface and a second surface that is opposite the first surface, and a first metal layer disposed on the first surface of the ceramic layer. The first metal layer is coupled with the second surface of the die attach paddle; a second metal layer disposed on the second surface of the ceramic layer; and forming a thermally conductive adhesive layer on the second metal layer such that at least a surface of the thermally conductive layer is exposed external to the semiconductor device package, the thermally conductive adhesive layer being configured for coupling the semiconductor device package with a thermal dissipation appliance.

In some aspects, the techniques described herein relate to a method where forming the thermally conductive adhesive layer includes forming a portion of the thermally conductive adhesive layer in a recess defined in the second metal layer.

In some aspects, the techniques described herein relate to a method where a first surface of the second metal layer is coupled with the second surface of the ceramic layer, and a second surface of the second metal layer is coupled with a first surface of the thermally conductive adhesive layer. The method further including, prior to forming the thermally conductive adhesive layer, encapsulating, in a molding compound, the die attach paddle and the semiconductor die, and partially encapsulating, in the molding compound, the DBM substrate, such that the second surface of the second metal layer is exposed through the molding compound.

In some aspects, the techniques described herein relate to a method where the second surface of the second metal layer is recessed in the molding compound, and a second surface of the thermally conductive adhesive layer opposite the first surface of the thermally conductive adhesive layer is coplanar with a surface of the molding compound.

In some aspects, the techniques described herein relate to a method where the second surface of the second metal layer is coplanar with a surface of the molding compound, and a second surface of the thermally conductive adhesive layer opposite the first surface of the thermally conductive adhesive layer is non-coplanar with the surface of the molding compound.

The details of one or more implementations are set forth in the accompanying drawings and the description below. Other features will be apparent from the description and drawings, and from the claims.

Figure 1:
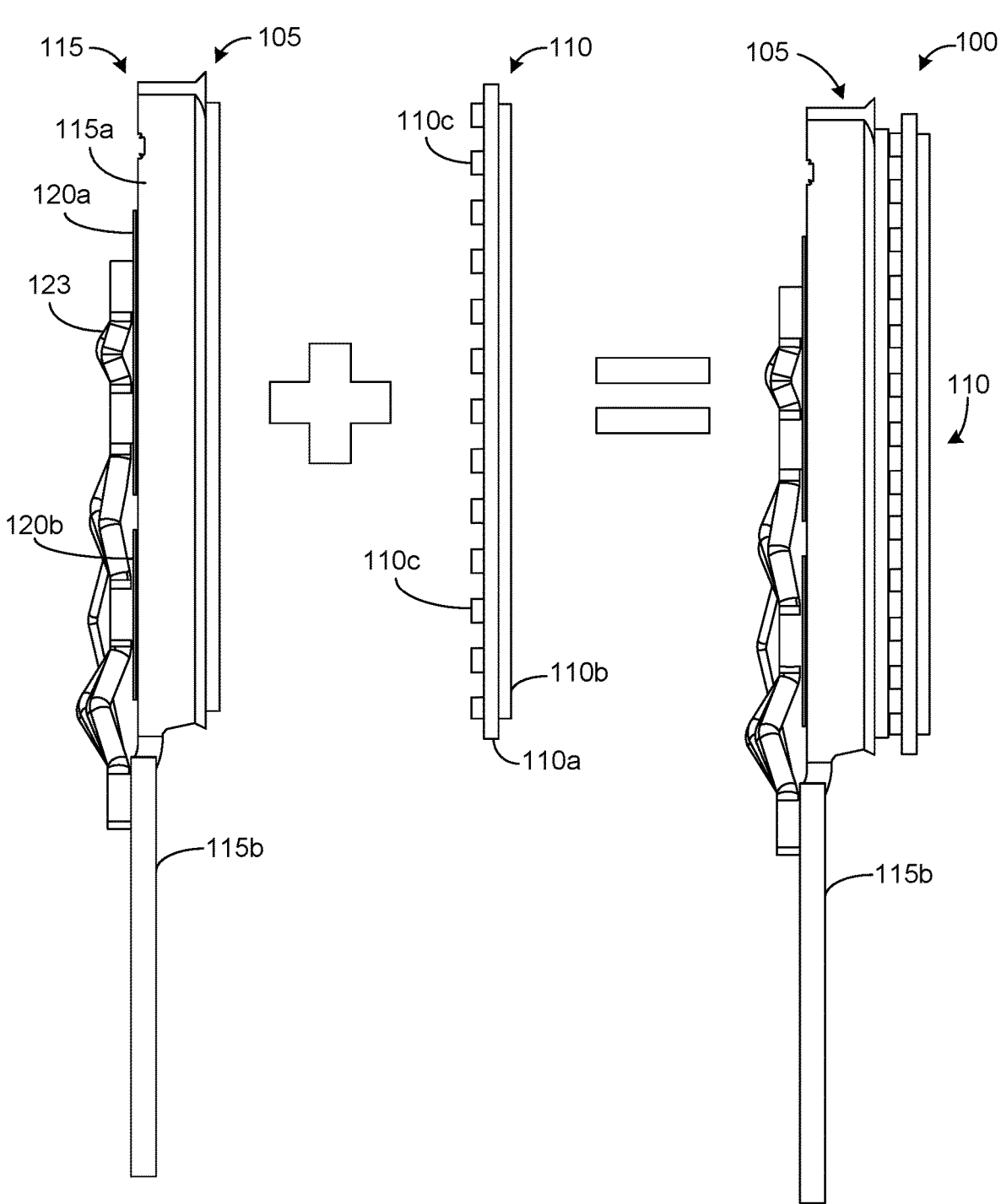
FIG. 1 is a diagram that illustrates attachment of an isolation substrate with a leadframe assembly of a semiconductor device package assembly.

In the drawings, reference numbers for like or similar elements may not be shown for each of those elements. Also, reference numbers from one view of a given implementation may be not be repeated in the related views. Further, in some instances, for purposes of comparing different views, reference numbers from one view of given implementation may be repeated in other views, but may not be specifically discussed with respect to each view.

DETAILED DESCRIPTION

This disclosure is directed to semiconductor device packages and associated manufacturing methods that can overcome at least some of the drawbacks discussed above. For instance, in implementations described herein, an isolation substrate can include a metal layer, for attachment to a die attach paddle, that has a patterned portion. The patterned portion can extend around at least a portion of a perimeter of the isolation substrate, or around an entire perimeter of the substrate. A central portion of the metal layer can be unpatterned. The patterned portion can reduce an amount of contact surface between the metal layer and the die attach paddle, which can reduce stresses associated with thermal cycling, where such stresses can result, in part, due to mismatch between coefficients of thermal expansion (CTE) of the insulating layer of the isolation substrate and metals of the isolation substrate (metal layers) and the die attach paddle.

For instance, in some implementations, the isolation substrate can be a direct-bonded metal (DBM) substrate, such as a direct-bonded copper (DBC) substrate, that includes a ceramic insulating layer. The metal layers and the die attach paddle, which can be include in a leadframe, can include copper, an alloy of copper, etc. Ceramics can have CTEs on the order of 3 to 5 parts per million (ppm), while copper has a CTE on the order of 17 ppm. This mismatch in CTEs causes thermal cycling related stresses that can result in cracking of a conductive adhesive material (e.g., solder) used to couple a DBM substrate with a die attach paddle, with these stresses exponentially increasing near the perimeter of the DBM substrate. In implementations described herein, patterning a metal layer of the DBM substrate along at least a portion of its perimeter reduces an amount of contact surface between a metal layer of the DBM substrate and the die attach paddle and, as result, can reduce associated thermal cycling stresses, which can reduce cracking caused by such stresses.

Implementations described herein can also overcome several drawbacks related to corrosion, or oxidation, of exposed metal surfaces (e.g., for thermal dissipation appliance attachment). For instance, as described herein, in some implementations, a semiconductor device package can include a conductive adhesive material that is disposed (e.g., applied and cured) on an exposed metal surface of semiconductor device package during a package assembly process, such as prior to packing and shipping to a customer for integration in a system or module. Such conductive adhesive materials can be thermally conductive, and can also be electrically conductive. Further, such conductive adhesive materials can be selected such that they are less susceptible to corrosion than the associated externally exposed metal layer (e.g., copper).

In some implementations, such a conductive adhesive material can be a solder material, a sintering material (e.g., silver or copper), an epoxy material (e.g., silver filled epoxy), or a plating material (e.g., a tin plating material). In some implementations, a conductive adhesive material can be a paste or a preformed sheet. In some implementations, a conductive adhesive material can be applied, and a curing (reflow) process can be performed to couple (adhere, etc.) the conductive adhesive material with the exposed metal layer surface.

Such approaches can also have additional benefits, as they can simplify a manufacturing process for integrating such semiconductor device packages in a system or module. For instance, screen printing of conductive adhesive material on a thermal dissipation appliance, such as complicated heat sinks, for attachment to a semiconductor device package can be omitted, as such attachment can be facilitated by the conductive adhesive material included on the semiconductor device package during the package assembly process (e.g., via a reflow process). Such approaches can also achieve additional quality improvements in associated systems and modules, as manufacturing environments of semiconductor package assembly typically have better environmental control than system and/or module manufacturing environments. Accordingly, quality and reliability of an end system or module can benefit from application of a conductive adhesive material during a semiconductor device package assembly process, as defects such as voids due to corrosion and/or contamination can be reduced.

Figure 2A:
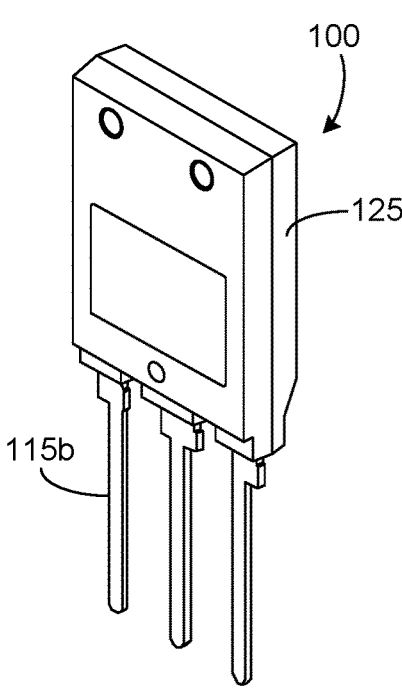
FIGS. 2A and 2B are diagrams that illustrate isometric views of a semiconductor device package assembly.
Figure 2B:
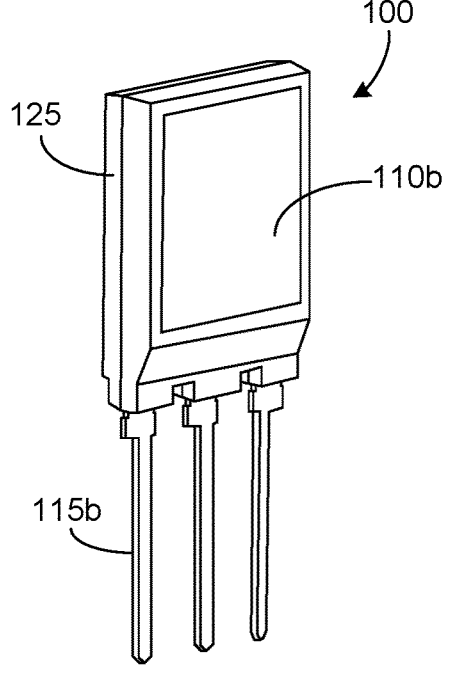

FIG. 1 is a diagram that illustrates attachment of an isolation substrate 110 with a leadframe assembly 105 of a semiconductor device package assembly 100. As shown in FIG. 1, the isolation substrate 110 can be coupled with the leadframe assembly 105 to produce the semiconductor device package assembly 100. In some implementations, such as shown in FIGS. 2A and 2B, the semiconductor device package assembly 100 can further include a molding compound (not shown in FIG. 1) that encapsulates portions of the semiconductor device package assembly 100 as shown in FIG. 1.

As illustrated in FIG. 1 (e.g., in the leftmost diagram), the leadframe assembly 105 can include a leadframe 115, a semiconductor die (die) 120a, a die 120b, and wire bonds 123. In some implementations, a semiconductor device package assembly can include fewer elements, additional elements, different elements, and/or can have a different arrangement than that shown in FIG. 1. The leadframe 115 of the leadframe assembly 105 includes a die attach paddle 115a, and signal leads 115b, where only a single signal lead is visible in FIG. 1. The die 120a and 120b are coupled with the die attach paddle 115a, such as using a die attach material which can include an epoxy, a eutectic material, and/or a solder material. The wire bonds 123 are used to electrically connect the signal leads 115b, the die 120a and the die 120b with one another.

Figure 3:
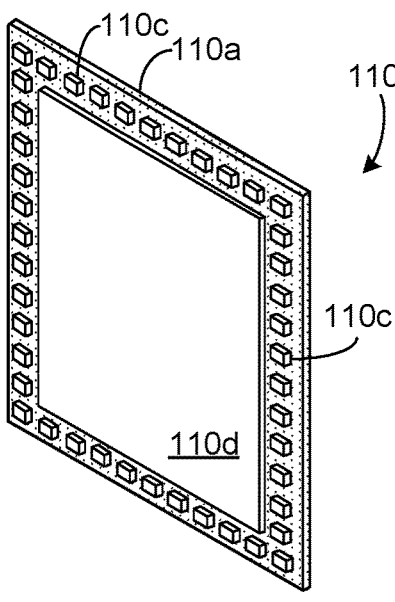
FIG. 3 is a diagram illustrating an isometric view of an example isolation substrate.

In the example of FIG. 1 (e.g., as illustrated in the middle diagram), the isolation substrate 110 includes a base layer 110a, which can be a ceramic base layer such as aluminum nitride, silicon nitride, zirconium nitride, etc. The isolation substrate 110 also includes a metal layer 110b, which can be a metal layer that has an externally exposed surface of the semiconductor device package assembly 100, e.g., after molding compound encapsulation. The isolation substrate 110 also includes, on a surface or side of the base layer 110a that is opposite a surface on which the metal layer 110b is disposed, a patterned metal layer that includes posts 110c. The posts 110c, such as illustrated in FIG. 3, can be disposed along, or around, at least a portion of an outer perimeter of the base layer 110a. For purposes of clarity, a central portion of a metal layer from which the posts 110c are defined is not shown in FIG. 1, so as not to obscure the posts 110c. As shown in FIG. 3, such a central portion of that metal layer can be disposed within the outer perimeter of the base layer 110a on which the posts 110c are defined.

As shown in FIG. 1 (e.g., in the rightmost diagram), the isolation substrate 110 can be coupled with the leadframe assembly 105 to form the semiconductor device package assembly 100, e.g. prior to molding compound encapsulation. In some implementations, the isolation substrate 110 can be coupled with the leadframe assembly 105 using solder material, sintering material, active metal brazing, etc. In some implementations, coupling the isolation substrate 110 with the leadframe assembly 105 can include performing a reflow process, or other process to facilitate attachment of the isolation substrate 110 with the leadframe assembly 105.

FIGS. 2A and 2B are diagrams that illustrate isometric views of a semiconductor device package assembly, e.g., the semiconductor device package assembly 100 after molding compound encapsulation. In this example, FIG. 2A is an isometric view of the semiconductor device package assembly 100 from the leadframe assembly 105 side, while FIG. 2B is an isometric view of the semiconductor device package assembly 100 from the isolation substrate 110 side. As shown in FIGS. 2A and 2B, a molding compound 125 can encapsulate the die attach paddle 115a, the die 120a, the die 120b, the wire bonds 123, and portions of the signal leads 115b, where signal leads 115b extend out of the wire bonds 123. As shown in FIG. 2B, the metal layer 110b can have a surface that is exposed (externally exposed) through the wire bonds 123. In some implementations, the semiconductor device package assembly 100 can be molding in a jig that prevents encapsulation of the exposed surface of the metal layer 110b. In other implementations, the surface of the metal layer 110b shown in FIG. 2B can be exposed using a grinding and/or etching process.

FIG. 3 is a diagram illustrating an isometric view of an example isolation substrate, e.g., the isolation substrate 110 of FIG. 1. As shown in FIG. 3, the isolation substrate 110 includes a patterned portion including a plurality of posts 110c that extends around an entire outer perimeter of the base layer 110a. A central portion 110d of the metal layer from which the posts 110c are defined is disposed within the patterned perimeter including the posts 110c. As noted above, patterning a metal layer to include the posts 110c can reduce a contact surface between a metal layer of the isolation substrate 110 and a die attach paddle, such as the die attach paddle 115a, which can reduce adverse effects (e.g., solder cracking) that can be caused by thermal cycling of the semiconductor device package assembly 100. That is, the reduced contact surface of the isolation substrate 110, e.g., along an outer perimeter of the isolation substrate 110, with the die attach paddle 115a can reduce the effects of thermal cycling stress along that perimeter, where such stresses can be greater than stresses associated with the central portion 110d of an associated metal layer used to define the posts 110c.

Figure 4:
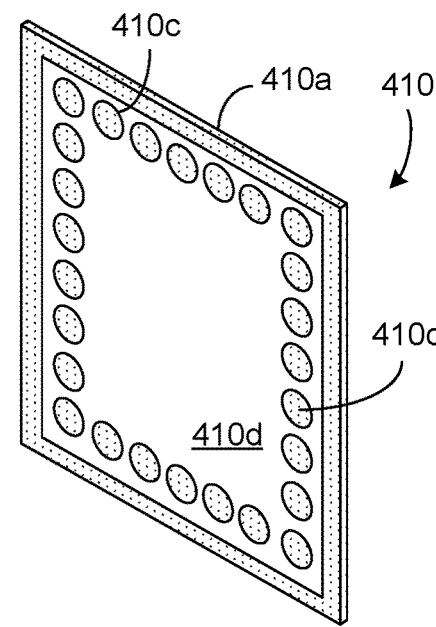
FIG. 4 is a diagram illustrating an isometric view of another example isolation substrate.

FIG. 4 is a diagram illustrating an isometric view of another example isolation substrate (isolation substrate 410). In the example, of FIG. 4, as compared to the isolation substrate 110, reduction of a contact surface between a metal layer disposed on a base layer 410a and a die attach paddle is achieved, by forming, or defining recesses 410c (wells, openings, etc.) in the metal layer, rather than defining posts. The recesses 410c, as with the posts 110c of the isolation substrate 110, are arranged along an outer perimeter of the base layer 410a, and a central portion 410d of a metal layer is disposed with that outer perimeter. Accordingly, the recesses 410c can, similar to the pattern of the posts 110c of the isolation substrate 110, reduce the contact surface area between the perimeter of the metal layer including the recesses 410c and a corresponding die attach paddle, e.g., where higher levels of thermal cycling related stresses can occur (e.g., as compared to the central portion 410d).

Figure 5A:
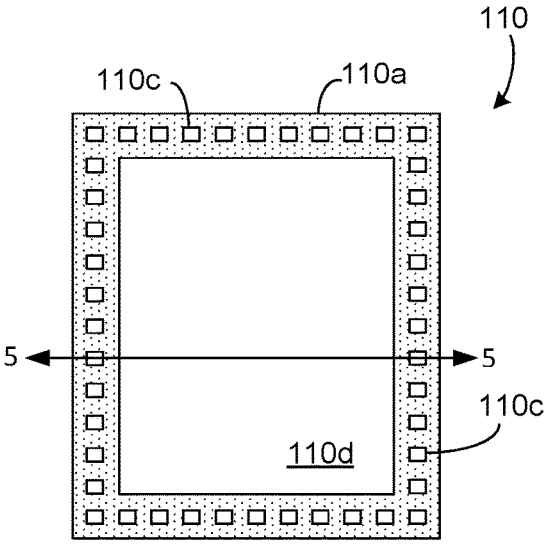
FIGS. 5A and 5B are diagrams that illustrate various views of the isolation substrate of FIG. 3.
Figure 5B:
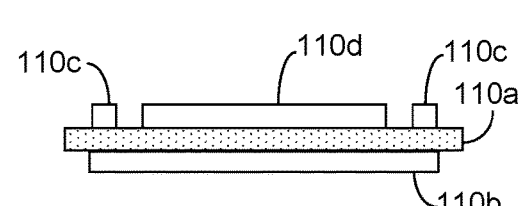

FIGS. 5A and 5B are diagrams that illustrate various views of the isolation substrate 110 of FIG. 3. For instance, FIG. 5A illustrates a plan view of the isolation substrate 110, while FIG. 5B illustrates a cross-sectional view of the isolation substrate 110 along a section line 5-5 shown in FIG. 5A. As shown in FIG. 5A, a metal layer is patterned to define the posts 110c around (along, etc.) an outer perimeter of the base layer 110a, where the posts 110c are spaced from edges of the base layer 110a, and also spaced from the central portion 110d of the metal layer from which the posts 110c can be defined. As shown in the cross-sectional view of FIG. 5B, the posts 110c and the central portion 110d of the metal layer are disposed on a top side (surface) of the base layer 110a, and the metal layer 110b is disposed on a bottom side (surface) of the base layer 110a, where the top surface of the base layer 110a is opposite the bottom surface of the base layer 110a.

Figure 6A:
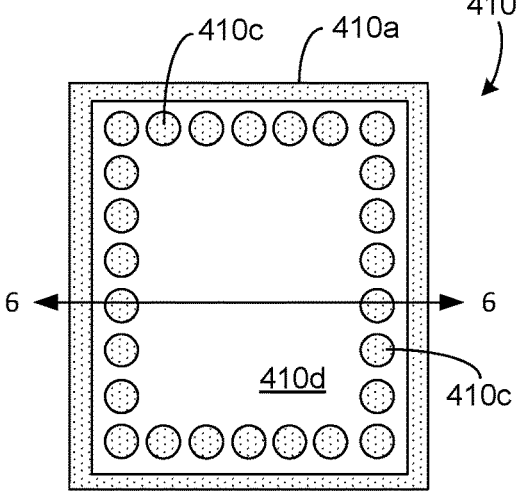
FIGS. 6A and 6B are diagrams that illustrate various views of the isolation substrate of FIG. 4.
Figure 6B:
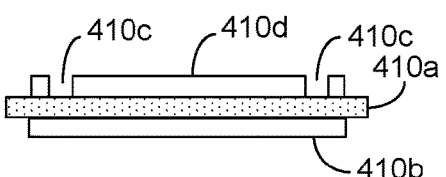

FIGS. 6A and 6B are diagrams that illustrate various views of the isolation substrate 410 of FIG. 4. For instance, FIG. 6A illustrates a plan view of the isolation substrate 410, while FIG. 6B illustrates a cross-sectional view of the isolation substrate 410 along a section line 6-6 shown in FIG. 6A. As shown in FIG. 6A, a metal layer is patterned to define the recesses 410c around an outer perimeter of the base layer 410a, where the recesses 410c are spaced from edges of the base layer 410a, as well as edges of the associated metal layer. In this example, the central portion 410d is disposed within the recesses 410c. As shown in the cross-sectional view of FIG. 6B, the recesses 410c are defined, and the central portion 410d of the metal layer is disposed on a top side (surface) of the base layer 410a, and the metal layer 410b is disposed on a bottom side (surface) of the base layer 410a, the top surface of the base layer 410a being opposite the bottom surface of the base layer 410a. For purposes of clarity, the recesses 410c are shown as open space without illustrating portions of the metal layer defining the recesses 410c (e.g., sidewalls of the recesses 410c).

Various approaches can be used to define the posts 110c of the isolation substrate 110 and/or the recesses 410c of the isolation substrate 410. For instance, etching processes can be used, metal patterns including the posts 110c or the recesses 410c can be formed without etching, e.g., can be pre-defined prior to attachment (e.g., using active metal brazing) to the respective base layer.

Figure 7:
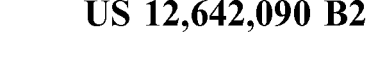
FIG. 7 is a diagram illustrating an example process for producing a semiconductor device package.

FIG. 7 is a diagram illustrating an example process for producing a semiconductor device package. The process of FIG. 7 is illustrated using the semiconductor device package assembly 100 as an example. In other implementations, the process of FIG. 7 can be used to produce other semiconductor device package assemblies. The process of FIG. 7 can overcome the drawbacks associated with corrosion of exposed metal layer discussed above, as well as provide the additional advantages of simplifying integration of the semiconductor device package assembly 100 in system or module described above.

As shown in FIG. 7, the semiconductor device package assembly 100 can be produced (as shown in FIG. 1) and encapsulated in the molding compound 125 (as shown in FIGS. 2A and 2B) with a surface of the metal layer 110b being exposed through the molding compound 125. As shown in FIG. 7 (block 710) functional testing is then performed on the semiconductor device package assembly 100 to ensure proper operation of the device, e.g., in conformance with corresponding product specifications. After the functional testing at block 710, a conductive adhesive material 720 can be applied to (adhered to, affixed to, coupled to, etc.) the exposed surface of the metal layer 110b, which can include a curing, sintering, or active metal brazing process. After application of the conductive adhesive material 720, the semiconductor device package assembly 100 can be packed, e.g., using tape and reel packing 730, for shipment to a customer. In some implementations, the semiconductor device package assembly 100 can be packed for shipment using other approaches. In such implementations, the conductive adhesive material 720 can be referred to as a pre-applied conductive adhesive material.

FIGS. 8A to 8C, 9A and 9B, 10A to 10C, 11A to 11C, 12A to 12C, and 13A to 13C are diagrams illustrating various views of semiconductor packages that include different configurations of pre-applied conductive adhesive material. In the examples of FIGS. 8A to 8C, 9A and 9B, 10A to 10C, 11A to 11C, 12A to 12C, and 13A to 13C, for purposes of illustration, the semiconductor packages are shown without explicitly illustrating a leadframe assembly, such as the leadframe assembly 105 shown in FIG. 1. However, in example implementations, the examples of FIGS. 8A to 8C, 9A and 9B, 10A to 10C, 11A to 11C, 12A to 12C, and 13A to 13C can include a leadframe assembly, such as the leadframe assembly 105. In other implementations, the examples of FIGS. 8A to 8C, 9A and 9B, 10A to 10C, 11A to 11C, 12A to 12C, and 13A to 13C can include leadframe assemblies having other configurations, e.g., that include a leadframe, one or more semiconductor die, and/or one or more wire bonds. Also in FIGS. 8A, 9A, 10A, 11A, 12A and 13, truncated signal leads, such as the signal leads 115b of FIGS. 1, 2A and 2B, are shown (without specific reference numbers) for purposes of comparison with other implementations described herein.

Figures 8A, 8B, 8C, 9A, 9B:
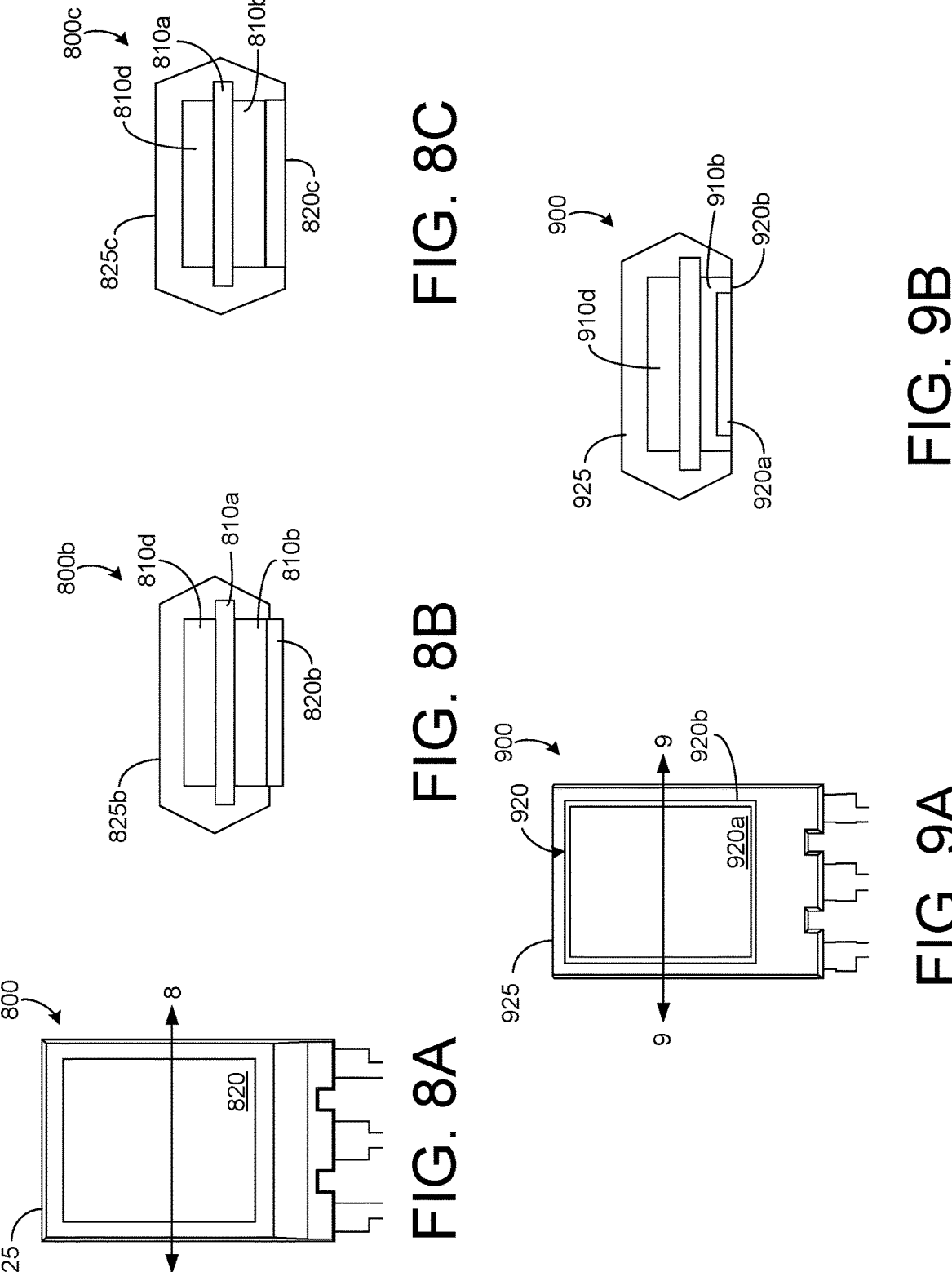
FIGS. 8A to 8C are diagrams illustrating various views of semiconductor device packages.
FIGS. 9A and 9B are diagrams illustrating various views of a semiconductor device package.

FIG. 8A illustrates a semiconductor device package 800. As shown in FIG. 8A, a portion of the semiconductor device package 800 is encapsulated in a molding compound 825, and a pre-applied conductive adhesive material 820 is included in the semiconductor device package 800, e.g., is disposed on a surface of a metal layer of an isolation substrate that is exposed through the molding compound 825 of the semiconductor device package 800. A section line 8-8 is shown in FIG. 8A, where the section line 8-8 corresponds with the cross-sectional views of FIGS. 8B and 8C.

Referring to FIG. 8B, a cross-sectional view of a semiconductor device package 800b, which is an implementation of the semiconductor device package 800, is illustrated. Again, the cross-sectional view of FIG. 8B corresponds with a view along the section line 8-8 of FIG. 8A, though a corresponding leadframe assembly is not shown in FIG. 8B, as was discussed above. As shown in FIG. 8B, the semiconductor device package 800b includes an isolation substrate having a base layer 810a, a metal layer 810b disposed on a first (bottom) surface of the base layer 810a, and a metal layer 810d disposed on a second (top) surface of the base layer 810a. In some implementations, such those described herein, the metal layer 810d can have a patterned perimeter, and can be coupled with a die attach paddle of a corresponding leadframe assembly.

A molding compound 825b of the semiconductor device package 800b can encapsulate the isolation substrate of the semiconductor device package 800b (as well as portions of a corresponding leadframe assembly). As shown in FIG. 8B, a pre-applied conductive adhesive material 820b can be disposed on (coupled to, etc.) a surface of the metal layer 810b that is exposed through the molding compound 825b. As shown in FIG. 8B, the pre-applied conductive adhesive material 820b can be disposed outside the molding compound 825b. For instance, a surface of the pre-applied conductive adhesive material 820b that is coupled to the metal layer 810b is coplanar with a bottom surface of the molding compound 825b, as shown in FIG. 8B, while a second surface of the pre-applied conductive adhesive material 820b that is outside the molding compound 825b is non-coplanar with the bottom surface of the molding compound 825b.

Referring to FIG. 8C, a cross-sectional view of a semiconductor device package 800c, which is another implementation of the semiconductor device package 800, is illustrated. Again, the cross-sectional view of FIG. 8C corresponds with a view along the section line 8-8 of FIG. 8A, though a corresponding leadframe assembly is not shown in FIG. 8C, as was discussed above. As shown in FIG. 8C, as with the semiconductor device package 800b, the semiconductor device package 800c includes an isolation substrate having the base layer 810a, the metal layer 810b disposed a first (bottom) surface of the base layer 810a, and the metal layer 810d disposed on a second (top) surface of the base layer 810a. In implementations, such as those described herein, the metal layer 810d can have a patterned perimeter, and can be coupled with a die attach paddle of a corresponding leadframe assembly.

A molding compound 825c of the semiconductor device package 800c can encapsulate the isolation substrate of semiconductor device package 800c (as well as portions of a corresponding leadframe assembly). As shown in FIG. 8C, a pre-applied conductive adhesive material 820c can be disposed on (coupled to, etc.) a surface of metal layer 810b that is exposed through the molding compound 825c. As shown in FIG. 8C, as compared to the semiconductor device package 800b of FIG. 8B, the pre-applied conductive adhesive material 820c can be disposed within the molding compound 825c. For instance, a surface of the pre-applied conductive adhesive material 820b that is coupled to the metal layer 810b is disposed within the molding compound

825c and is non-coplanar with a bottom surface of the molding compound 825c, as shown in FIG. 8C, while a second surface of the pre-applied conductive adhesive material 820b is exposed through the molding compound 825c and is coplanar with the bottom surface of the molding compound 825c.

FIG. 9A illustrates a semiconductor device package 900. As shown in FIG. 9A, a portion of the semiconductor device package 900 is encapsulated in a molding compound 925, and a pre-applied conductive adhesive material 920a is included in the semiconductor device package 900, e.g., is disposed on a surface of a metal layer of an isolation substrate that is exposed through the molding compound 925 of the semiconductor device package 900. In this example, the pre-applied conductive adhesive material 920a can be disposed within a recess 922 defined in the metal layer of the isolation substrate. For instance, a half-etch process can be performed to define such a recess, though other processes, such as stamping processes can be used. A section line 9-9 is shown in FIG. 9A, where the section line 9-9 corresponds with the cross-sectional view of FIG. 9B.

Referring to FIG. 9B, a cross-sectional view of a semiconductor device package 900 is illustrated. Again, the cross-sectional view of FIG. 9B corresponds with a view along the section line 9-9 of FIG. 9A, though a corresponding leadframe assembly is not shown in FIG. 9B, as was discussed above. As shown in FIG. 9B, the semiconductor device package 900 includes an isolation substrate having a base layer 910a, a metal layer 910b disposed on a first (bottom) surface of the base layer 910a, and a metal layer 910d disposed on a second (top) surface of the base layer 910a. In some implementations, such those described herein, the metal layer 910d can have a patterned perimeter, and can be coupled with a die attach paddle of a corresponding leadframe assembly.

The molding compound 925 of the semiconductor device package 900 can encapsulate the isolation substrate of the semiconductor device package 900 (as well as portions of a corresponding leadframe assembly). As shown in FIG. 9B, the recess 922 is defined in the metal layer 910b, and the pre-applied conductive adhesive material 920a is disposed in the recess 922. In this example, the recess 922 is formed on a side of the metal layer 910b that has a surface that is exposed through the molding compound 925. As shown in FIG. 9B, the pre-applied conductive adhesive material 920a can be disposed within the recess 922. For instance, a top surface of the pre-applied conductive adhesive material 920a that is coupled to the metal layer 910b is within the recess 922 and is non-coplanar with a bottom surface of the molding compound 925, and non-coplanar with a surface 920b of the metal layer 910b that is exposed on a bottom surface of the semiconductor device package 900. A second surface of the pre-applied conductive adhesive material 920a that is externally exposed along the bottom of the semiconductor device package 900 is coplanar with the bottom surface of the molding compound 925, and coplanar with the surface 920b of the metal layer 910b. Side (vertical) surfaces of the pre-applied conductive adhesive material 920a are also be disposed withing the recess 922, and in contact with vertical walls of the recess 922.

Figures 10A, 10B, 10C, 11A, 11B, 11C:
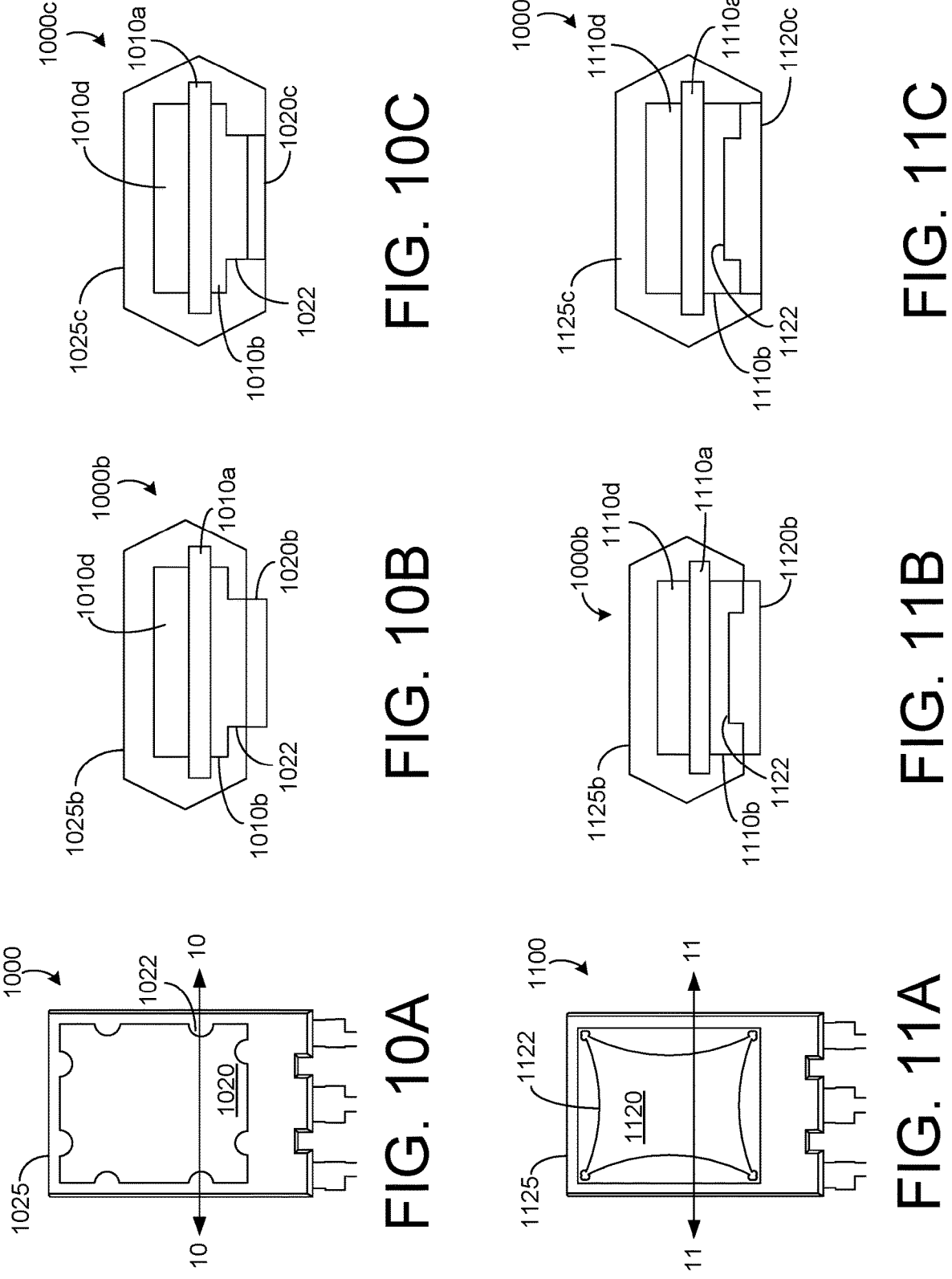
FIGS. 10A to 10C are diagrams illustrating various views of semiconductor device packages.
FIGS. 11A to 11C are diagrams illustrating various views of semiconductor device packages.

FIG. 10A illustrates a semiconductor device package 1000. As shown in FIG. 10A, a portion of the semiconductor device package 1000 is encapsulated in a molding compound 1025, and a pre-applied conductive adhesive material 1020 is included in the semiconductor device package 1000, e.g., is disposed on a surface of a metal layer of an isolation substrate that is exposed through the molding compound 1025 of the semiconductor device package 1000. As shown in FIG. 10A, notches 1022 can be formed in a metal layer on which the pre-applied conductive adhesive material 1020 (FIG. 10B) is disposed, and in the pre-applied conductive adhesive material 1020 (FIG. 10C), where the notches 1022 are filled with the molding compound 1025. Such an arrangement can provide mechanical stability between the molding compound 1025 and the associated isolation substrate and/or the pre-applied conductive adhesive material 1020. A section line 10-10 is shown in FIG. 10A, where the section line 10-10 corresponds with the cross-sectional views of FIGS. 10B and 10C. As shown in FIG. 10A, the notches 1022 narrow a width (or length) of the pre-applied conductive adhesive material 1020 (and the underlying metal layer 1010b), as compared with unnotched portions.

Referring to FIG. 10B, a cross-sectional view of a semiconductor device package 1000b, which is an implementation of the semiconductor device package 1000, is illustrated. Again, the cross-sectional view of FIG. 10B corresponds with a view along the section line 10-10 of FIG. 10A, though a corresponding leadframe assembly is not shown in FIG. 10B, as was discussed above. As shown in FIG. 10B, the semiconductor device package 1000b includes an isolation substrate having a base layer 1010a, a metal layer 1010b disposed on a first (bottom) surface of the base layer 1010a, and a metal layer 1010d disposed on a second (top) surface of the base layer 1010a. In some implementations, such those described herein, the metal layer 1010d can have a patterned perimeter, and can be coupled with a die attach paddle of a corresponding leadframe assembly.

A molding compound 1025b of the semiconductor device package 1000b can encapsulate the isolation substrate of the semiconductor device package 1000b (as well as portions of a corresponding leadframe assembly). As shown in FIG. 10B, a pre-applied conductive adhesive material 1020b can be disposed on (coupled to, etc.) a surface of the metal layer 1010b that is exposed through the molding compound 1025b, where the metal layer 1010b. and the pre-applied conductive adhesive material 1020b are narrowed by the notches 1022. In some implementations, the notches 1022 in the metal layer 1010b can be formed using a half etch process.

As shown in FIG. 10B, the pre-applied conductive adhesive material 1020b can be disposed outside the molding compound 1025b. For instance, a surface of the pre-applied conductive adhesive material 1020b that is coupled to the metal layer 1010b is coplanar with a bottom surface of the molding compound 1025b, as shown in FIG. 10B, while a second surface of the pre-applied conductive adhesive material 1020b that is outside the molding compound 1025b is non-coplanar with the bottom surface of the molding compound 1025b.

Referring to FIG. 10C, a cross-sectional view of a semiconductor device package 1000c, which is another implementation of the semiconductor device package 1000, is illustrated. Again, the cross-sectional view of FIG. 10C corresponds with a view along the section line 10-10 of FIG. 10A, though a corresponding leadframe assembly is not shown in FIG. 10C, as was discussed above. As shown in FIG. 10C, as with the semiconductor device package 1000b, the semiconductor device package 1000c includes an isolation substrate having the base layer 1010a, the metal layer 1010b disposed a first (bottom) surface of the base layer 1010a, and the metal layer 1010d disposed on a second (top) surface of the base layer 1010a. In implementations, such as those described herein, the metal layer 1010d can have a patterned perimeter, and can be coupled with a die attach paddle of a corresponding leadframe assembly.

A molding compound 1025c of the semiconductor device package 1000c can encapsulate the isolation substrate of the semiconductor device package 1000c (as well as portions of a corresponding leadframe assembly). As shown in FIG. 10C, a pre-applied conductive adhesive material 1020c can be disposed on (coupled to, etc.) a surface of the metal layer 1010b that is exposed through the molding compound 1025c. As shown in FIG. 10C, as compared to the semiconductor device package 1000b of FIG. 10B, the pre-applied conductive adhesive material 1020c can be disposed within the molding compound 1025c. For instance, a surface of the pre-applied conductive adhesive material 1020b that is coupled to the metal layer 1010b is disposed within the molding compound 1025c and is non-coplanar with a bottom surface of the molding compound 1025c, as shown in FIG. 10C, while a second surface of the pre-applied conductive adhesive material 1020b is exposed through the molding compound 1025c and is coplanar with the bottom surface of the molding compound 1025c.

FIG. 11A illustrates a semiconductor device package 1100. As shown in FIG. 11A, a portion of the semiconductor device package 1100 is encapsulated in a molding compound 1125, and a pre-applied conductive adhesive material 1120 is included in the semiconductor device package 1100, e.g., is disposed on a metal layer of an isolation substrate of the semiconductor device package 1100. As shown in FIG. 11A, a recess 1122 (an hour-glass shaped recess) can be defined in the metal layer on which the pre-applied conductive adhesive material 1120 is disposed. In FIG. 11A, an outline of the recess 1122 is shown for purpose of illustration, and for comparison with FIGS. 11B and 11C. That is, in the view of FIG. 11A, the recess 1122 is covered by the pre-applied conductive adhesive material 1120 and, therefore, is not visible in that view. Such an arrangement can provide mechanical stability between the molding compound 1125 and the associated isolation substrate and/or the pre-applied conductive adhesive material 1120. A section line 11-11 is shown in FIG. 11A, where the section line 11-11 corresponds with the cross-sectional views of FIGS. 11B and 11C.

Referring to FIG. 11B, a cross-sectional view of a semiconductor device package 1100b, which is an implementation of the semiconductor device package 1100, is illustrated. Again, the cross-sectional view of FIG. 11B corresponds with a view along the section line 11-11 of FIG. 11A, though a corresponding leadframe assembly is not shown in FIG. 11B, as was discussed above. As shown in FIG. 11B, the semiconductor device package 1100b includes an isolation substrate having a base layer 1110a, a metal layer 1110b disposed on a first (bottom) surface of the base layer 1110a, and a metal layer 1110d disposed on a second (top) surface of the base layer 1110a. In some implementations, such those described herein, the metal layer 1110d can have a patterned perimeter, and can be coupled with a die attach paddle of a corresponding leadframe assembly.

A molding compound 1125b of the semiconductor device package 1100b can encapsulate the isolation substrate of the semiconductor device package 1100b (as well as portions of a corresponding leadframe assembly). As shown in FIG. 11B, a pre-applied conductive adhesive material 1120b can be disposed on (coupled to, etc.) the metal layer 1110b, including being disposed in the recess 1122 defined in the metal layer 1110b, where a portion of the pre-applied conductive adhesive material 1120b disposed within the recess 1122 can be narrower than a portion of the pre-applied conductive adhesive material 1120b disposed outside the recess 1122. In some implementations, the recess 1122 in the metal layer 1110b can be formed using a half etch process.

As shown in FIG. 11B, a portion of the pre-applied conductive adhesive material 1120b can be disposed outside the molding compound 1125b (and outside the recess 1122), while another portion of the pre-applied conductive adhesive material 1120b can be disposed within the molding compound, and within the recess 1122. For instance, an upper surface of the pre-applied conductive adhesive material 1120b that is coupled to the metal layer 1110b is within the molding compound 1125b and non-coplanar with a bottom surface of the molding compound 1125b, as shown in FIG. 11B, while a second (bottom) surface of the pre-applied conductive adhesive material 1120b that is outside the molding compound 1125b is also non-coplanar, but parallel with the bottom surface of the molding compound 1125b.

Referring to FIG. 11C, a cross-sectional view of a semiconductor device package 1100c, which is another implementation of the semiconductor device package 1100, is illustrated. Again, the cross-sectional view of FIG. 11C corresponds with a view along the section line 11-11 of FIG. 11A, though a corresponding leadframe assembly is not shown in FIG. 11C, as was discussed above. As shown in FIG. 11C, as with the semiconductor device package 1100b, the semiconductor device package 1100c includes an isolation substrate having the base layer 1110a, the metal layer 1110b disposed a first (bottom) surface of the base layer 1110a, and the metal layer 1110d disposed on a second (top) surface of the base layer 1110a. In implementations, such as those described herein, the metal layer 1110d can have a patterned perimeter, and can be coupled with a die attach paddle of a corresponding leadframe assembly.

A molding compound 1125c of the semiconductor device package 1100c can encapsulate the isolation substrate of the semiconductor device package 1100c (as well as portions of a corresponding leadframe assembly). As shown in FIG. 11C, a pre-applied conductive adhesive material 1120c can be disposed on (coupled to, etc.) the metal layer 1110b, including in the recess 1122. As shown in FIG. 11C, as compared to the semiconductor device package 1100b of FIG. 11B, the pre-applied conductive adhesive material 1120c can be disposed within the molding compound 1125c. For instance, an upper surface of the pre-applied conductive adhesive material 1120b that is coupled to the metal layer 1110b in the recess 1122 is disposed within the molding compound 1125c and is non-coplanar with a bottom surface of the molding compound 1125c, as shown in FIG. 11C, while a second (bottom) surface of the pre-applied conductive adhesive material 1120b is exposed through the molding compound 1125c and is coplanar with the bottom surface of the molding compound 1125c.

Figures 12A, 12B, 12C, 13A, 13B, 13C:
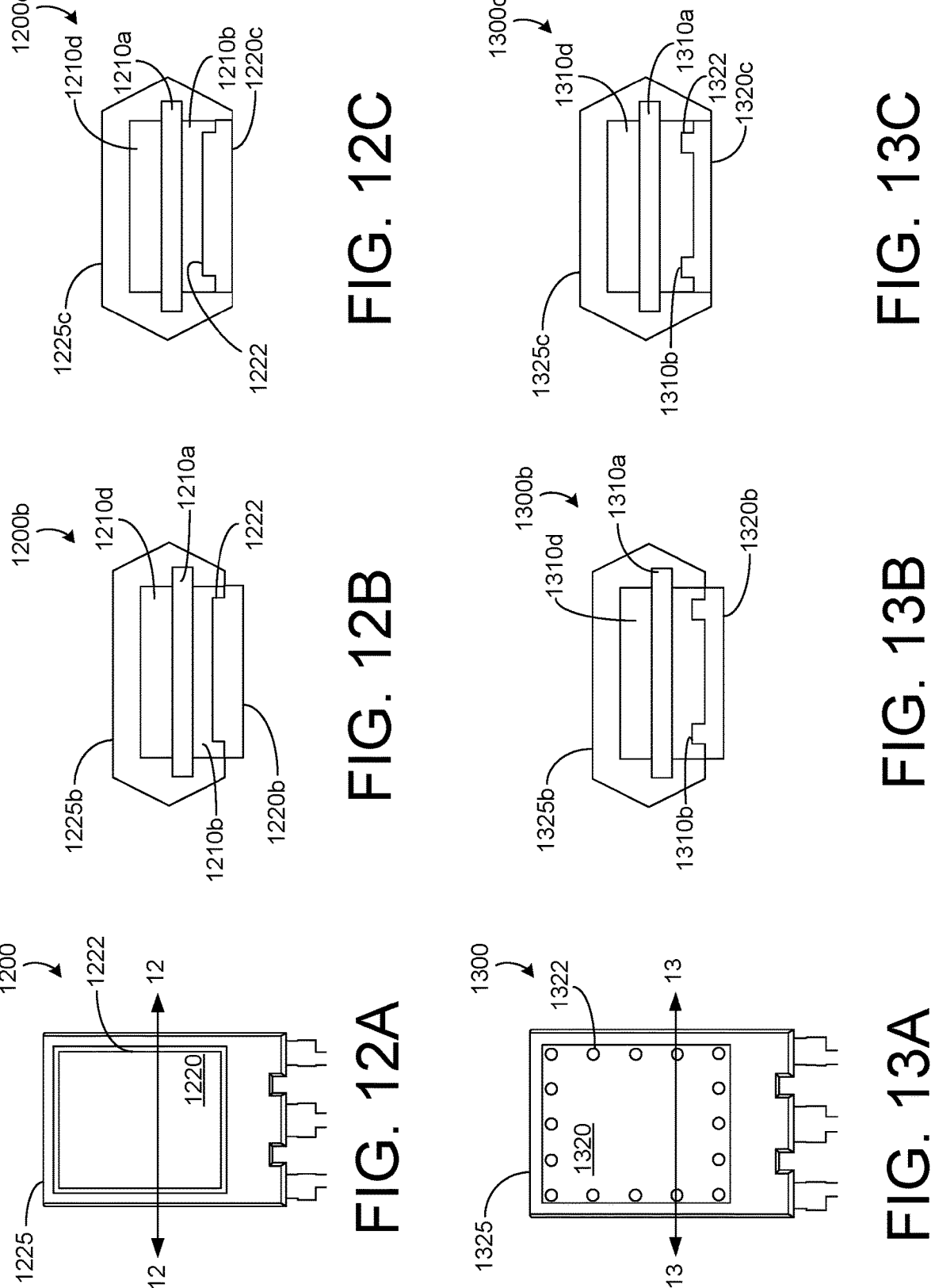
FIGS. 12A to 12C are diagrams illustrating various views of semiconductor device packages.
FIGS. 13A to 13C are diagrams illustrating various views of semiconductor device packages.

FIG. 12A illustrates a semiconductor device package 1200. As shown in FIG. 12A, a portion of the semiconductor device package 1200 is encapsulated in a molding compound 1225, and a pre-applied conductive adhesive material 1220 is included in the semiconductor device package 1200, e.g., is disposed on a metal layer of an isolation substrate of the semiconductor device package 1200. As shown in FIG. 12A, a recess 1222 (a rectangular-shaped recess) can be defined in the metal layer on which the pre-applied conductive adhesive material 1220 is disposed. In FIG. 12A, an outline of the recess 1222 is shown for purpose of illustration, and for comparison with FIGS. 12B and 12C. That is, in the view of FIG. 12A, the recess 1222 is covered by the pre-applied conductive adhesive material 1220 and, therefore, is not visible in that view. Such an arrangement can provide mechanical stability between the molding compound 1225 and the associated isolation substrate and/or the pre-applied conductive adhesive material 1220. A section line 12-12 is shown in FIG. 12A, where the section line 12-12 corresponds with the cross-sectional views of FIGS. 12B and 12C.

Referring to FIG. 12B, a cross-sectional view of a semiconductor device package 1200b, which is an implementation of the semiconductor device package 1200, is illustrated. Again, the cross-sectional view of FIG. 12B corresponds with a view along the section line 12-12 of FIG. 12A, though a corresponding leadframe assembly is not shown in FIG. 12B, as was discussed above. As shown in FIG. 12B, the semiconductor device package 1200b includes an isolation substrate having a base layer 1210a, a metal layer 1210b disposed on a first (bottom) surface of the base layer 1210a, and a metal layer 1210d disposed on a second (top) surface of the base layer 1210a. In some implementations, such those described herein, the metal layer 1210d can have a patterned perimeter, and can be coupled with a die attach paddle of a corresponding leadframe assembly.

A molding compound 1225b of the semiconductor device package 1200b can encapsulate the isolation substrate of the semiconductor device package 1200b (as well as portions of a corresponding leadframe assembly). As shown in FIG. 12B, a pre-applied conductive adhesive material 1220b can be disposed on (coupled to, etc.) the metal layer 1210b, including being disposed in the recess 1222 defined in the metal layer 1210b, where a portion of the pre-applied conductive adhesive material 1220b disposed within the recess 1222 can be narrower than a portion of the pre-applied conductive adhesive material 1220b disposed outside the recess 1222. In some implementations, the recess 1222 in the metal layer 1210b can be formed using a half etch process.

As shown in FIG. 12B, a portion of the pre-applied conductive adhesive material 1220b can be disposed outside the molding compound 1225b (and outside the recess 1222), while another portion of the pre-applied conductive adhesive material 1220b can be disposed within the molding compound 1225b, and within the recess 1222. For instance, an upper surface of the pre-applied conductive adhesive material 1220b that is coupled to the metal layer 1210b is within the molding compound 1225b and non-coplanar with a bottom surface of the molding compound 1225b, as shown in FIG. 12B, while a second (bottom) surface of the pre-applied conductive adhesive material 1220b that is outside the molding compound 1225b is also non-coplanar, but parallel with the bottom surface of the molding compound 1225b.

Referring to FIG. 12C, a cross-sectional view of a semiconductor device package 1200c, which is another implementation of the semiconductor device package 1200, is illustrated. Again, the cross-sectional view of FIG. 12C corresponds with a view along the section line 12-12 of FIG. 12A, though a corresponding leadframe assembly is not shown in FIG. 12C, as was discussed above. As shown in FIG. 12C, as with the semiconductor device package 1200b, the semiconductor device package 1200c includes an isolation substrate having the base layer 1210a, the metal layer 1210b disposed a first (bottom) surface of the base layer 1210a, and the metal layer 1210d disposed on a second (top) surface of the base layer 1210a. In implementations, such as those described herein, the metal layer 1210d can have a patterned perimeter, and can be coupled with a die attach paddle of a corresponding leadframe assembly.

A molding compound 1225c of the semiconductor device package 1200c can encapsulate the isolation substrate of the semiconductor device package 1200c (as well as portions of a corresponding leadframe assembly). As shown in FIG. 12C, a pre-applied conductive adhesive material 1220c can be disposed on (coupled to, etc.) the metal layer 1210b, including in the recess 1222. As shown in FIG. 12C, as compared to the semiconductor device package 1200b of FIG. 12B, the pre-applied conductive adhesive material 1220c can be disposed within the molding compound 1225c. For instance, an upper surface of the pre-applied conductive adhesive material 1220b that is coupled to the metal layer 1210b in the recess 1222 is disposed within the molding compound 1225c and is non-coplanar with a bottom surface of the molding compound 1225c, as shown in FIG. 12C, while a second (bottom) surface of the pre-applied conductive adhesive material 1220b is exposed through the molding compound 1225c and is coplanar with the bottom surface of the molding compound 1225c.

FIG. 13A illustrates a semiconductor device package 1300. As shown in FIG. 13A, a portion of the semiconductor device package 1300 is encapsulated in a molding compound 1325, and a pre-applied conductive adhesive material 1320 is included in the semiconductor device package 1300, e.g., is disposed on a metal layer of an isolation substrate of the semiconductor device package 1300. As shown in FIG. 13A, recesses 1322 can be defined in the metal layer on which the pre-applied conductive adhesive material 1320 is disposed, e.g., around at least a portion of a perimeter of the metal layer. In FIG. 13A, outlines of the recesses 1322 are shown for purpose of illustration, and for comparison with FIGS. 13B and 13C. That is, in the view of FIG. 13A, the recesses 1322 are covered by the pre-applied conductive adhesive material 1320 and, therefore, are not visible in that view. Such an arrangement can provide mechanical stability between the pre-applied conductive adhesive material 1320 and the underlying metal layer of the isolation substrate. A section line 13-13 is shown in FIG. 13A, where the section line 13-13 corresponds with the cross-sectional views of FIGS. 13B and 13C.

Referring to FIG. 13B, a cross-sectional view of a semiconductor device package 1300b, which is an implementation of the semiconductor device package 1300, is illustrated. Again, the cross-sectional view of FIG. 13B corresponds with a view along the section line 13-13 of FIG. 13A, though a corresponding leadframe assembly is not shown in FIG. 13B, as was discussed above. As shown in FIG. 13B, the semiconductor device package 1300b includes an isolation substrate having a base layer 1310a, a metal layer 1310b disposed on a first (bottom) surface of the base layer 1310a, and a metal layer 1310d disposed on a second (top) surface of the base layer 1310a. In some implementations, such those described herein, the metal layer 1310d can have a patterned perimeter, and can be coupled with a die attach paddle of a corresponding leadframe assembly.

A molding compound 1325b of the semiconductor device package 1300b can encapsulate the isolation substrate of the semiconductor device package 1300b (as well as portions of a corresponding leadframe assembly). As shown in FIG. 13B, a pre-applied conductive adhesive material 1320b can be disposed on (coupled to, etc.) the metal layer 1310b, including being disposed in the recesses 1322 defined in the metal layer 1310b, where portions of the pre-applied conductive adhesive material 1320b disposed within the recesses 1322 can be in the shape of circular posts. In some implementations, the recesses 1322 in the metal layer 1310b can be formed using a half etch process.

As shown in FIG. 13B, a portion of the pre-applied conductive adhesive material 1320b can be disposed outside the molding compound 1325b (and outside the recesses 1322), while other portions of the pre-applied conductive adhesive material 1320b can be disposed within the molding compound 1325b and, respectively, within the recesses 1322. For instance, upper surfaces of the pre-applied conductive adhesive material 1320b that are coupled to the metal layer 1310b in the recesses 1322 are within the molding compound 1325b and non-coplanar with a bottom surface of the molding compound 1325b, as shown in FIG. 13B, while a (bottom) surface of the pre-applied conductive adhesive material 1320b that is outside the molding compound 1325b is also non-coplanar, but parallel with the bottom surface of the molding compound 1325b.

Referring to FIG. 13C, a cross-sectional view of a semiconductor device package 1300c, which is another implementation of the semiconductor device package 1300, is illustrated. Again, the cross-sectional view of FIG. 13C corresponds with a view along the section line 13-13 of FIG. 13A, though a corresponding leadframe assembly is not shown in FIG. 13C, as was discussed above. As shown in FIG. 13C, as with the semiconductor device package 1300b, the semiconductor device package 1300c includes an isolation substrate having the base layer 1310a, the metal layer 1310b disposed a first (bottom) surface of the base layer 1310a, and the metal layer 1310d disposed on a second (top) surface of the base layer 1310a. In implementations, such as those described herein, the metal layer 1310d can have a patterned perimeter, and can be coupled with a die attach paddle of a corresponding leadframe assembly.

A molding compound 1325c of the semiconductor device package 1300c can encapsulate the isolation substrate of the semiconductor device package 1300c (as well as portions of a corresponding leadframe assembly). As shown in FIG. 13C, a pre-applied conductive adhesive material 1320c can be disposed on (coupled to, etc.) the metal layer 1310b, including in the recesses 1322. As shown in FIG. 13C, as compared to the semiconductor device package 1300b of FIG. 13B, the pre-applied conductive adhesive material 1320c can be disposed within the molding compound 1325c. For instance, upper surfaces of the pre-applied conductive adhesive material 1320b that are coupled to the metal layer 1310b within the recesses 1322 are disposed within the molding compound 1325c, and are non-coplanar with a bottom surface of the molding compound 1325c, as shown in FIG. 13C, while a (bottom) surface of the pre-applied conductive adhesive material 1320b is exposed through the molding compound 1325c and is coplanar with the bottom surface of the molding compound 1325c.

Figure 14:
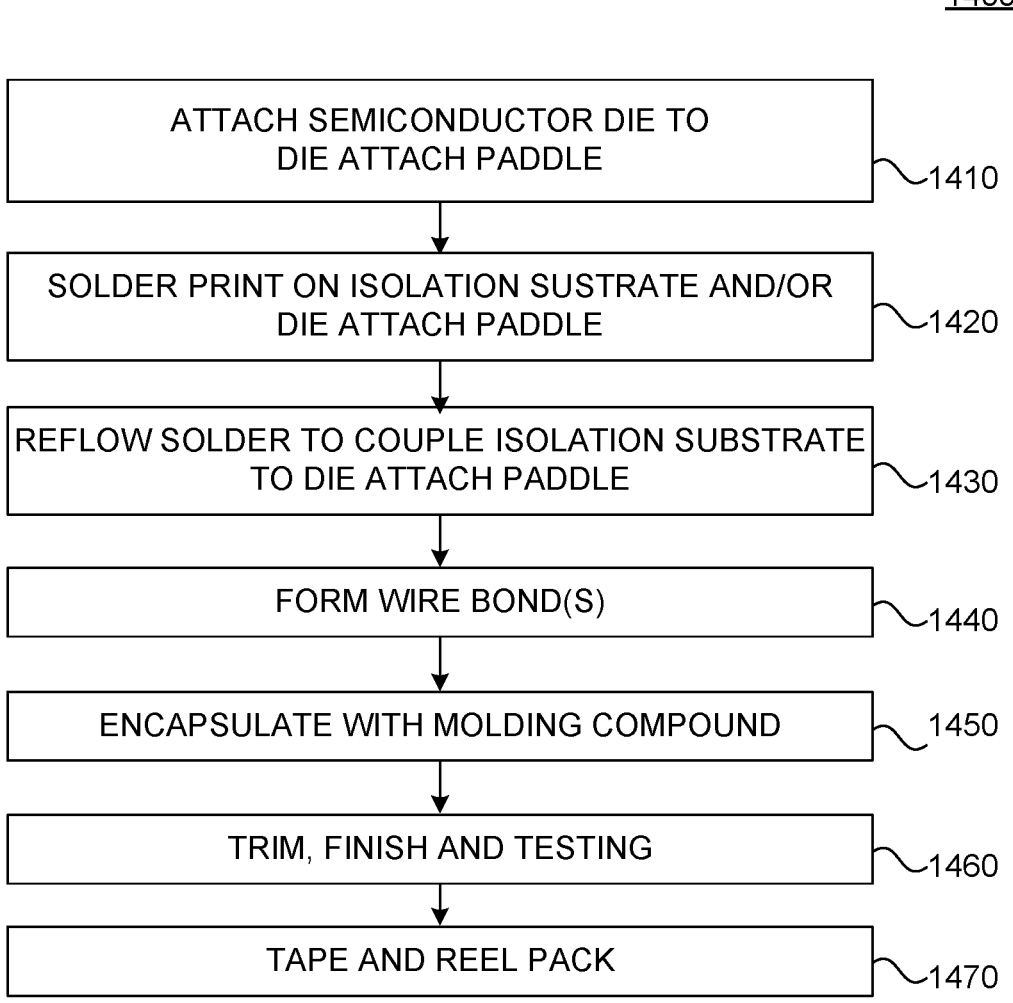
FIG. 14 is flowchart illustrating a process for producing a semiconductor device package.

FIG. 14 is flowchart illustrating a process 1400 for producing a semiconductor device package, such as the semiconductor device package assembly 100 of FIGS. 1, 2A and 2B. Accordingly, for purposes of illustration, the process 1400 will be described with further reference to FIGS. 1, 2A and 2B. However, in some implementations, the process 1400 can be used to produce other semiconductor device package assemblies.

As shown in FIG. 14, at block 1410, the process 1400 includes attaching (coupling) the die 120a and the die 120b to the die attach paddle 115a, e.g., using a solder, eutectic die attach, or an epoxy. At block 1420, a solder printing operation can be performed on the die attach paddle and/or on the isolation substrate 110 (the side including the posts 110c). At block 1430, the isolation substrate 110 can be coupled to the die attach paddle 115a (e.g., in the arrangement shown in FIG. 1) using a solder reflow operation. In some implementations, other approaches can be used to couple the isolation substrate 110 to the die attach paddle 115a, such as sintering or active metal brazing.

At block 1440, wire bonds 123 are formed to the leadframe 115, the die 120a and the die 120b. At block 1450, the semiconductor device package assembly 100 is encapsulated with the molding compound 125. At block 1460 trim (e.g., leadframe trim), and finish (e.g., dejunk and deflash) operations are performed on the semiconductor device package assembly 100. Also at block 1460, functional testing of the semiconductor device package assembly 100 is performed, where devices that do not pass functional testing can be discarded. At block 1470, packing for shipment is performed, e.g., using tape and reel packing.

Figure 15:
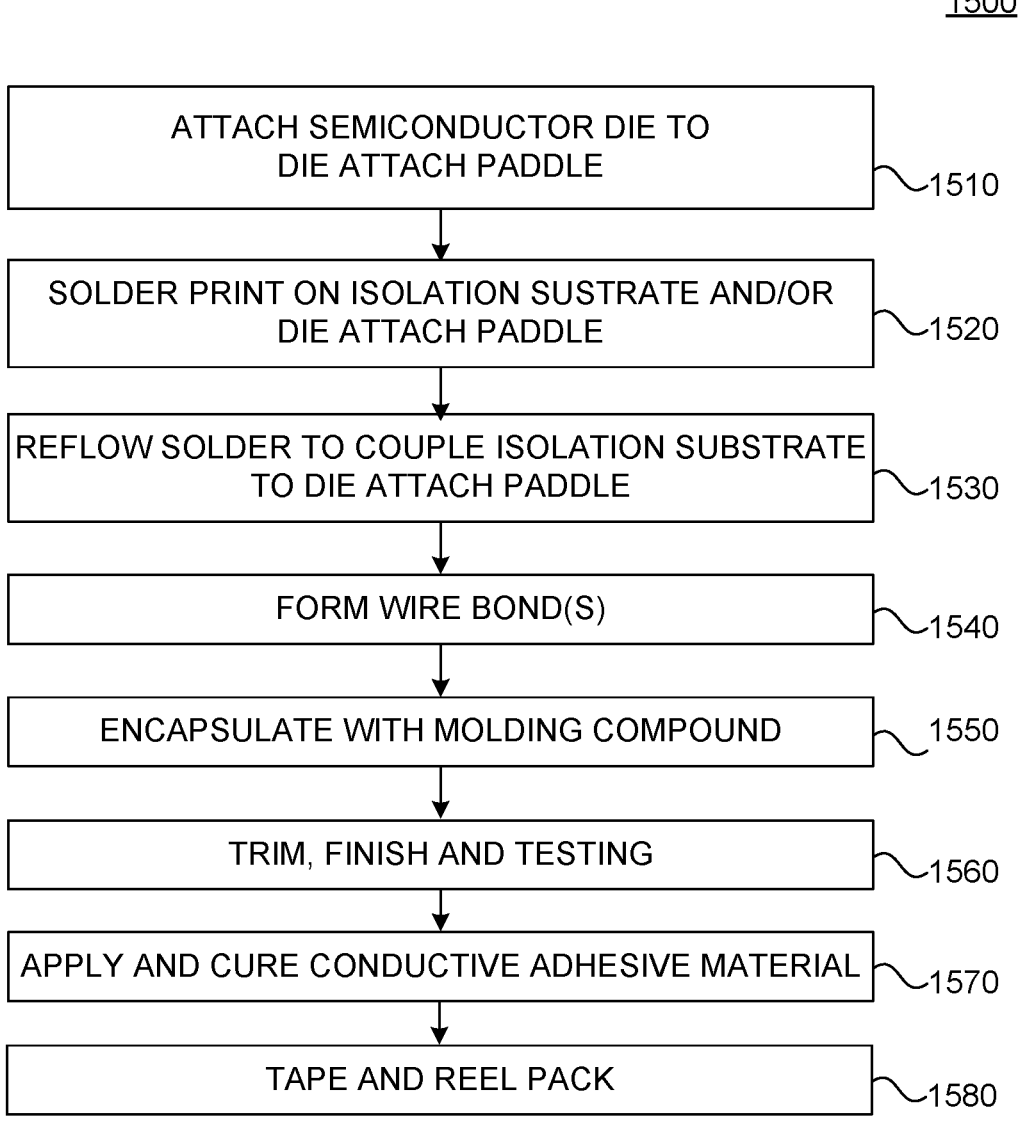
FIG. 15 is flowchart illustrating another process for producing a semiconductor device package.

FIG. 15 is flowchart illustrating a process 1500 for producing a semiconductor device package, such as the semiconductor device package assembly 100 of FIGS. 1, 2A, 2B and 7. Accordingly, for purposes of illustration, the process 1500 will be described with further reference to FIGS. 1, 2A, 2B and 7. However, in some implementations, the process 1500 can be used to produce other semiconductor device package assemblies.

As shown in FIG. 15, at block 1510, the process 1500 includes attaching (coupling) the die 120a and the die 120b to the die attach paddle 115a, e.g., using a solder, eutectic die attach, or an epoxy. At block 1520, a solder printing operation can be performed on the die attach paddle and/or on the isolation substrate 110, e.g., the side including the posts 110c. In some implementations, an isolation substrate without a pattern defined in a metal layer (e.g., the posts 110c and/or the recesses 410c) can be used. At block 1530, the isolation substrate 110 can be coupled to the die attach paddle 115a (e.g., in the arrangement shown in FIG. 1) using a solder reflow operation. In some implementations, other approaches can be used to couple the isolation substrate 110 to the die attach paddle 115a, such as sintering or active metal brazing.

At block 1540, wire bonds 123 are formed to the leadframe 115, the die 120a and the die 120b. At block 1550, the semiconductor device package assembly 100 is encapsulated with the molding compound 125. At block 1560 trim (e.g., leadframe trim), and finish (e.g., dejunk and deflash) operations are performed on the semiconductor device package assembly 100. Also at block 1560, functional testing of the semiconductor device package assembly 100 is performed, where devices that do not pass functional testing can be discarded. At block 1570, the conductive adhesive material 720 can be applied and/or cured on an exposed surface of a metal layer of the associated isolation substrate. At block 1580, packing for shipment is performed, e.g., using tape and reel packing. In some implementations, operations of the processes 1400 and 1500 can be performed in orders other than those shown and described herein.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device package comprising:
a direct-bonded-metal (DBM) substrate including a ceramic layer interposed between a first metal layer and a second metal layer;
a semiconductor die coupled to the first metal layer via a die attach paddle;
a molding compound partially encapsulating the DBM substrate such that the second metal layer is exposed through an opening in the molding compound, the second metal layer being recessed in the opening of the molding compound; and
a thermally conductive adhesive disposed on the second metal layer in the opening, at least a surface of the thermally conductive adhesive being exposed external to the semiconductor device package wherein the second metal layer includes a recess, a portion of the thermally conductive adhesive being disposed in the recess.

2. The semiconductor device package of claim 1, wherein the thermally conductive adhesive is electrically conductive.

3. The semiconductor device package of claim 1, wherein:
the second metal layer includes a notch disposed at a perimeter edge of the second metal layer; and
a portion of the thermally conductive adhesive is disposed in the notch.

4. The semiconductor device package of claim 1, wherein the surface of the thermally conductive adhesive is coplanar with a surface of the molding compound.

5. The semiconductor device package of claim 1, wherein the surface of the thermally conductive adhesive is non-coplanar with the surface of the molding compound.

6. The semiconductor device package of claim 1, wherein:

the first metal layer includes an etched pattern disposed around at least a portion of a perimeter of the first metal layer, and the etched pattern is defined by removing a portion of the first metal layer.

7. The semiconductor device package of claim 1, wherein the thermally conductive adhesive is applied and cured prior to coupling the semiconductor device package with an external apparatus.

8. The semiconductor device package of claim 1, wherein the die attach paddle is included in a leadframe.

9. A semiconductor device package comprising:

a direct-bonded-metal (DBM) substrate including a ceramic layer interposed between a first metal layer and a second metal layer; and a semiconductor die coupled to the first metal layer via a die attach paddle, the first metal layer including an etched pattern disposed around at least a portion of a perimeter of the first metal layer forming a non-etched central planar portion.

10. The semiconductor device package of claim 9, wherein the etched pattern includes a plurality of posts defined from the first metal layer.

11. The semiconductor device package of claim 9, wherein the etched pattern includes a plurality of recesses defined in the first metal layer.

12. The semiconductor device package of claim 9, wherein a removed portion of the first metal layer exposes a corresponding portion of the ceramic layer.

13. The semiconductor device package of claim 9, wherein the etched pattern extends around an entire perimeter of the first metal layer.

14. The semiconductor device package of claim 9, further comprising a thermally conductive adhesive layer disposed on the second metal layer and exposed external to the semiconductor device package, wherein the thermally conductive adhesive layer is cured without coupling the semiconductor device package to an external apparatus.

15. The semiconductor device package of claim 9, further comprising a molding compound partially encapsulating the DBM substrate, such that the second metal layer is exposed through an opening in the molding compound, the second metal layer being recessed in the opening of the molding compound.

16. The semiconductor device package of claim 9, wherein the die attach paddle is included in a leadframe.

17. A method for producing a semiconductor device package, the method comprising:

coupling a semiconductor die to a direct-bonded-metal (DBM) substrate via a die attach paddle, the DBM substrate including a ceramic layer interposed between a first metal layer and a second metal layer, the semiconductor die being attached to the first metal layer;

partially encapsulating the DBM substrate in a molding compound such that the second metal layer is exposed through an opening in the molding compound, the second metal layer being recessed in the opening of the molding compound; and forming a thermally conductive adhesive layer on the second metal layer such that a surface of the thermally conductive adhesive layer is exposed external to the semiconductor device package, wherein a portion of the thermally conductive adhesive layer is formed in a recess defined in the second metal layer.

18. The method of claim 17, wherein the surface of the thermally conductive adhesive layer is coplanar with a surface of the molding compound.

19. The method of claim 17, wherein the surface of the thermally conductive adhesive layer is non-coplanar with the surface of the molding compound.

20. The method of claim 17, wherein the thermally conductive adhesive layer is applied and cured prior to coupling the semiconductor device package with an external apparatus.

* * * * *